United States Patent
Tu et al.

Patent Number: 5,962,344
Date of Patent: Oct. 5, 1999

[54] PLASMA TREATMENT METHOD FOR PECVD SILICON NITRIDE FILMS FOR IMPROVED PASSIVATION LAYERS ON SEMICONDUCTOR METAL INTERCONNECTIONS

[75] Inventors: Yeur-Luen Tu, Taipei; Shiang-Peng Cheng, Hsinchu; Kwong-Jr Tsai, Chunghsung; Liang-Gi Yao, Taipei, all of Taiwan

[73] Assignee: Vanguard International Semiconductor Corporation, Hsin-Chu, Taiwan

[21] Appl. No.: 08/999,229

[22] Filed: Dec. 29, 1997

[51] Int. Cl.[6] .................................................. H01L 21/441
[52] U.S. Cl. .......................... 438/694; 438/692; 438/700; 438/791; 438/778
[58] Field of Search .................................... 438/700, 692, 438/725, 778, 791, 694

[56] References Cited

U.S. PATENT DOCUMENTS

| | | | |
|---|---|---|---|
| 5,176,790 | 1/1993 | Arleo et al. | 438/724 |
| 5,269,879 | 12/1993 | Rhoades et al. | 438/712 |
| 5,272,361 | 12/1993 | Yamazaki | 257/66 |
| 5,273,920 | 12/1993 | Kwasnick et al. | 438/158 |
| 5,296,404 | 3/1994 | Akahori et al. | 437/173 |
| 5,300,460 | 4/1994 | Collins et al. | 438/712 |
| 5,433,823 | 7/1995 | Cain | 156/662.1 |
| 5,554,418 | 9/1996 | Ito et al. | 427/579 |

*Primary Examiner*—Benjamin Utech
*Assistant Examiner*—Duy-Vu Deo
*Attorney, Agent, or Firm*—George O. Saile; Stephen B. Ackerman

[57] ABSTRACT

A plasma treatment method used to form improved PECVD silicon nitride film passivation layers over metal interconnections on ULSI circuits is achieved. The process is carried out in a single PECVD reactor. After depositing a thin silicon oxide stress-release layer over the metal lines, a plasma-enhanced CVD silicon nitride layer is deposited, and subsequently a plasma treatment step is carried out on the silicon nitride layer. The use of a sufficiently thin silicon nitride layer eliminates photoresist trapping at the next photoresist process step that would otherwise be trapped in the voids (keyholes) that typically form in the silicon nitride passivation layer between the closely spaced metal lines, and can cause corrosion of the metal. The plasma treatment in He, Ar, or a mixture of the two, is then used to densify the silicon nitride layer and to substantially reduce pinholes that would otherwise cause interlevel metal shorts.

25 Claims, 3 Drawing Sheets

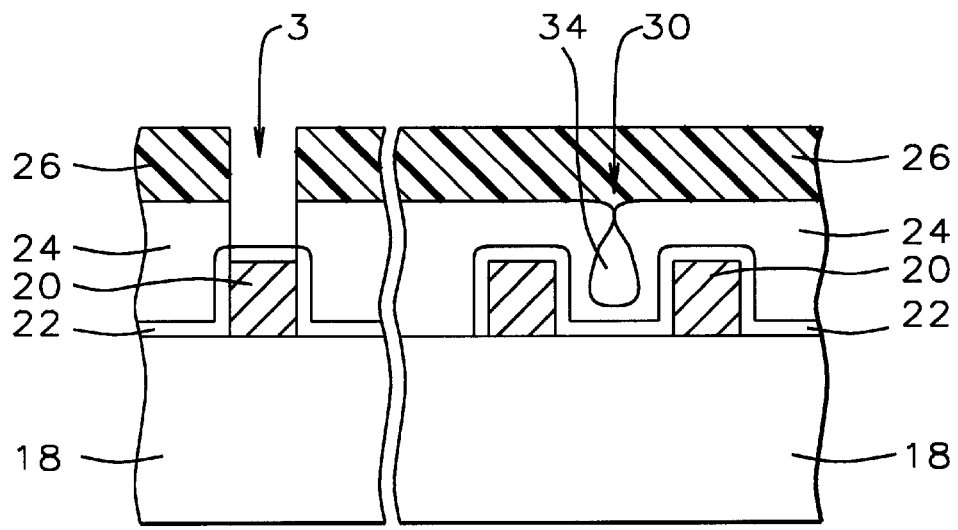
FIG. 1 — Prior Art
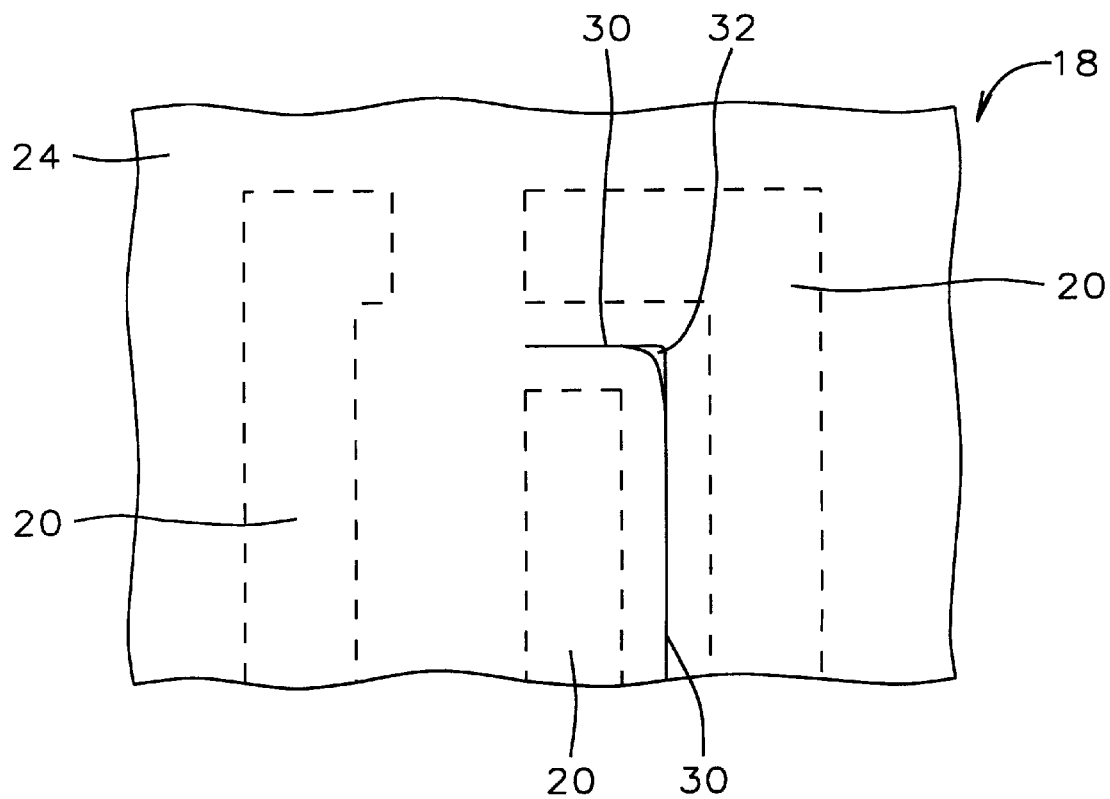
FIG. 2 — Prior Art

PLASMA TREATMENT METHOD FOR PECVD SILICON NITRIDE FILMS FOR IMPROVED PASSIVATION LAYERS ON SEMICONDUCTOR METAL INTERCONNECTIONS

BACKGROUND OF THE INVENTION (1) Field of the Invention

The present invention relates to a method for plasma treating a silicon nitride ($Si_3N_4$) passivation layer over closely spaced metal interconnections for integrated circuits on semiconductor substrates, and more particularly relates to a method for eliminating trapped photoresist in the voids (keyholes) that would otherwise outgas during the next level of metal deposition causing metal corrosion. The method also increases the densification of the $Si_3N_4$ layer thereby reducing the number of pinholes in the $Si_3N_4$ layer that can cause interlevel shorts.

(2) Description of the Prior Art

Multilevels of metal interconnections are used on Ultra Large Scale Integration (ULSI) integrated circuits to wire-up the discrete semiconductor devices on the semi-conductor chips. The different levels of interconnections are separated by layers of insulating material, such as plasma-enhanced chemical vapor deposited (PECVD) silicon oxide and silicon nitride layers. The silicon nitride layers also serve as passivation layers to prevent contamination, for example by light ions such as sodium, that would otherwise degrade the electrical properties of the underlying semiconductor devices. Typically the insulation and passivation layers require low temperature deposition processing (<400° C.) because the metal lines which are usually formed from Al/Cu alloys have a low melting temperature (about 660° C.).

Unfortunately, as the metal lines that form the interconnections are made closer together to satisfy the higher packing density for ULSI integrated circuits, the aspect ratio (the width of the spacings between metal lines to the metal thickness) increases. This results in the formation of voids (keyholes) in the nonconformal insulating or passivation layer that is deposited next. These voids are particularly prevalent when the passivation layer, usually a silicon nitride, is deposited at low temperatures by PECVD resulting in the nonconformal layer.

The void formation or keyhole problem is best understood with reference to FIGS. 1 and 2. Referring to FIG. 1, a schematic cross-sectional view of a portion of the substrate 18 is shown having two closely spaced inter-connecting metal lines 20. Over the metal lines 20 is first deposited a thin PECVD silicon oxide layer 22 that acts as a stress-release layer for the $Si_3N_4$ layer 24 which is deposited next. As is depicted in FIG. 1, the deposition flux of the deposited $Si_3N_4$ layer is higher at the top corners of the closely spaced metal lines than in the recess between them. This results in the formation of voids 34 having a keyhole shape. When the next photoresist layer 26 is deposited and patterned to form the via hole 3 elsewhere on the substrate 18, residual photoresist can be trapped in the voids 34 under the region 30 in the $Si_3N_4$ layer 24. The incomplete removal of the residual photoresist then results in contamination and corrosion of the subsequent metal layer when the trapped photoresist outgases during the subsequent metal deposition step. This can be a serious problem, for example when the via holes are etched to second level metal lines (M2) for the pad metal electrical contacts on dynamic random access memory (DRAM) chips. One way the photoresist can be trapped is depicted in the schematic top view of FIG. 2 of metal lines 20 having the $Si_3N_4$ layer 24 thereon. When the photoresist is applied in liquid form by spin coating, the photoresist can enter at the openings 32 at the corners of the metal lines 20. Subsequently, after etching the via holes and removing the photoresist and depositing the next metal layer, the trapped photoresist in the voids 34 (FIG. 1) can outgas or blow-out photoresist along the seam 30 in the passivation layer 24. This results in corrosion of the next metal layer and further can cause reliability problems. Another problem with low-temperature PECVD processing is the porosity of the passivation layer 24 which is also more susceptible to pinhole formation that can result in penetration of mobile ions leading to metal-to-metal shorts.

One method for depositing a passivation layer is described by Ito et al. in U.S. Pat. No. 5,554,418, in which a CVD silicon oxide is deposited on a substrate composed of a resinous or plastic material, and teaches a method of depositing oxide without attacking the underlying substrate. However, Ito does not teach a method of eliminating the problem associated with keyholes as described above.

Another method for depositing thin metal nitride layers is described by Akahori et al., U.S. Pat. No. 5,296,404, but also does not address the keyhole problem.

Therefore, there is still a need to improve the silicon nitride passivation layer over closely spaced metal lines by avoiding photoresist outgassing from voids (keyholes) and by reducing pinhole in the passivation layer that can cause electrical shorts.

SUMMARY OF THE INVENTION

A principal object of the present invention is to provide an improved plasma-enhanced chemical vapor deposited thin silicon nitride passivation layer (about 3–5K Angstroms) over metal interconnections by plasma treating the silicon nitride surface. This method eliminates keyhole formation and therefore avoids trapping of the photoresist in voids (keyholes) in the thin nitride layer between the closely spaced metal lines.

It is another object of this invention to use the plasma treatment process to concurrently densify the silicon nitride layer thereby reducing the number of pinholes in the passivation layer, since the thinner nitride passivation layer used to eliminate pinholes is more vulnerable to fail pinhole test (i.e., there are more continuous pinholes in a thin nitride layer).

In summary, this invention utilizes a sequence of processing steps that deposit a thin stress-release silicon oxide ($SiO_2$) layer and a thin silicon nitride ($Si_3N_4$) layer over closely spaced metal lines, followed by a plasma treatment process sequentially in the same plasma-enhanced chemical vapor deposition (PECVD) system.

The invention starts by providing a semiconductor substrate having partially completed integrated circuits consisting, for example, of field effect transistors (FETs) and having interconnecting metal layers. Although the $Si_3N_4$ layer is typically used as a passivation layer on the second level of patterned metal lines prior to forming the pad contacts on DRAM devices, it should be understood that the method is generally applicable where a $Si_3N_4$ layer over closely spaced metal lines is required. Next, a metal layer, such as aluminum/copper (Al/Cu) is deposited on the substrate and patterned to form the narrow spaced metal lines. A thin silicon oxide layer is deposited over the metal lines to provide a stress-release layer for the silicon nitride layer that is deposited next. A silicon nitride layer is deposited in the same PECVD system after changing the reactant gas mixture. The silicon nitride layer is typically nonconformal and results in keyholes because of the nature of the deposition which provides a higher flux of deposition material at the top of the metal lines than is deposited in the recesses between the metal lines when the $Si_3N_4$ is thicker than some critical thickness. To minimize the keyhole problem, a thinner $Si_3N_4$ layer is required. To reduce the number of pinholes in this thinner $Si_3N_4$ layer, by the method of this invention, an RF purge is carried out immediately following the $Si_3N_4$ deposition, and a plasma treatment is performed on the $Si_3N4$ layer using an inert gas such as helium (He) or argon (Ar), or a mixture of the two. After the photoresist is deposited by conventional techniques and patterned, the via holes are etched down to the metal lines, and the photoresist is stripped, for example by plasma ashing in oxygen ($O_2$) without leaving any photoresist residue. Also, the plasma treatment densifies the silicon nitride passivation layer results in fewer pinholes in the $Si_3N_4$ that would otherwise cause reliability concerns.

BRIEF DESCRIPTION OF THE DRAWINGS

The objects and other advantages of this invention are best understood with reference to the preferred embodiment when read in conjunction with the following drawings.

FIG. 1 is a schematic cross-sectional view of the prior art showing the formation of channel voids (keyholes) in the silicon nitride passivation layer using the conventional deposition method.

FIG. 2 shows a top view of the structure in the prior art in FIG. 1, which depicts an opening at the corner of the metal lines where photoresist can enter the channel void during the spin-on deposition and is subsequently trapped.

DESCRIPTION OF THE PREFERRED EMBODIMENT

The present invention relates to a method for fabricating an improved silicon nitride passivation layer over closely spaced metal lines used for metal electrical interconnections on semiconductor substrates for ULSI circuits. The method utilizes a sequence of process steps which are carried out consecutively in a single plasma-enhanced chemical vapor deposition (PECVD) system which includes a sequence of plasma treatment steps that reduces the pinhole count in the $Si_3N_4$ passivation layer. Although the method is particularly applicable to DRAM technology having minimum feature sizes of 0.35 microns (um) to 0.25 um and second level metal spacings between 0.575 and 0.475 um, it should be well understood by one skilled in the art that the method is generally applicable to narrowly spaced metal lines for other circuit applications.

Figure 3:
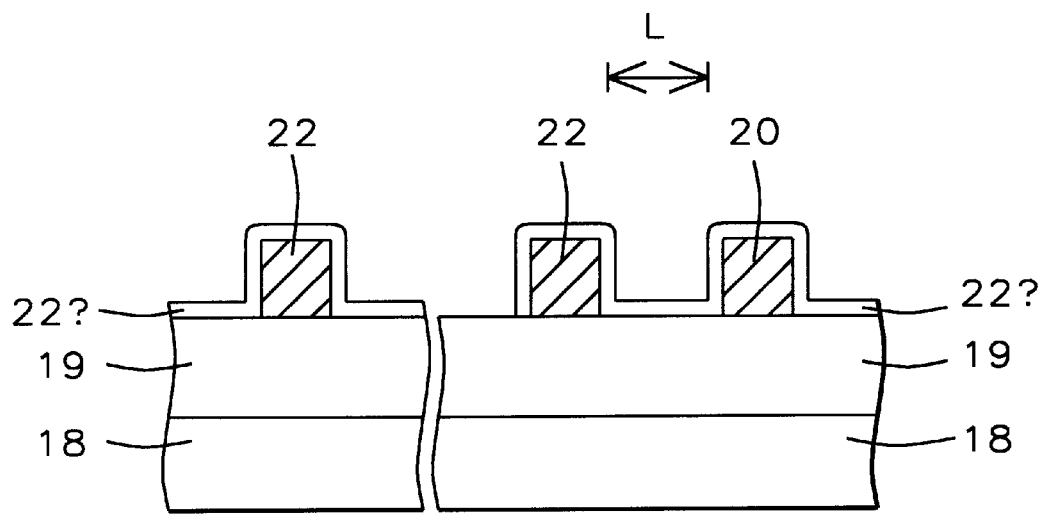
FIGS. 3, 4, 5 are schematic cross-sectional views depicting the sequence of process steps for making the passivation layer over the metal lines by the method of this invention.

Referring to FIG. 3, a schematic cross-sectional view is shown of a portion of a semiconductor substrate 18. FIG. 3 shows the top portion of a semiconductor substrate having partially completed integrated circuits, but does not depict the underlying circuit structure to simplify the drawings and the discussion. The substrate 18 is typically composed of a single crystal silicon having a <100> crystallographic orientation in which the active devices are formed. Before depositing and patterning the desired metal to form the metal interconnections, an insulating layer 19 is deposited to insulate the underlying partially completed integrated circuits from the next level of metal interconnections.

Still referring to FIG. 3, the next level of metal interconnections is formed by depositing a metal layer 20 on the insulated substrate 18. Typically the metal is composed of aluminum/copper (Al/Cu) alloy, which can be deposited, for example, by physical vapor deposition (PVD) such as by sputtering, and depending on the metal level, would vary in thickness. For example, if the metal layer forms the second level of metallization for a DRAM, the thickness would be between about 5000 and 9000 Angstroms.

Figure 4:
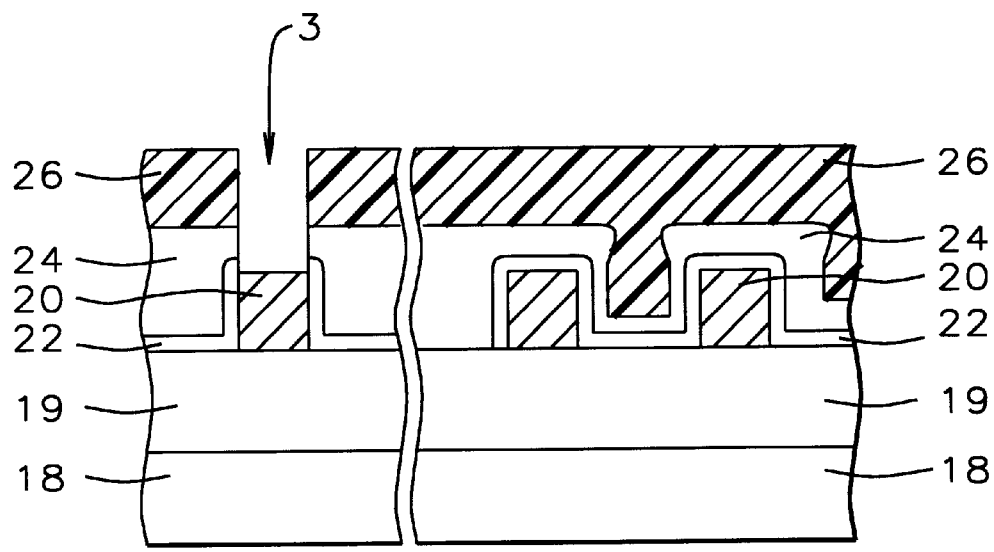

Now by the method of this invention, and still referring to FIG. 3, a thin silicon oxide ($SiO_2$) layer 22 is deposited over the metal lines 20 which provides a stress-release layer for the silicon nitride layer 24 that is deposited next, as shown in FIG. 4. Sequentially in the same PECVD system, the silicon nitride passivation layer 24 is deposited followed by a plasma treatment step. The process sequence can be performed in a model P5000 PECVD reactor manufactured by Applied Materials Corporation of Calif., U.S.A., and the processing parameters are given in

TABLE I

| | Column | | | | |
| --- | --- | --- | --- | --- | --- |
| Steps | 1 SiOx | 2 Stabilize | 3 $Si_3N_4$ | 4 Stabilize | 5 Dens |
| 1) Time | 3.0 | 10 | 45 | 10 | 50–100 |
| 2) Press. | 2.5 | 4.2 | 4.2 | 3.0 | 3.0 |
| 3) Power | 230 | 0 | 690 | 0 | 50–250 |
| 4) $N_2O$ | 1600 | 0 | 0 | 0 | 0 |
| 5) $SiH_4$ | 90 | 270 | 265 | 0 | 0 |
| 6) $NH_3$ | 0 | 110 | 110 | 0 | 0 |
| 7) $N_2$ | 0 | 4000 | 4000 | 0 | 0 |
| 8) He or Ar | 0 | 0 | 0 | 400–700 | 400–700 |
| 9) Spacing | 430 | 600 | 600 | 600 | 600 |
| 10) Temp | 400 | 400 | 400 | 400 | 400 |

The columns 1 through 5 show, respectively, the deposition of the CVD $SiO_2$ layer 22 (col 1), a stabilizing step during gas change (col. 2), the CVD-$Si_3N_4$ deposition step (col. 3), followed by a stabilization (col. 4) in which the gas mixture is changed to He, and a plasma treatment (densification) step (col. 5). The rows 1 through 10 show the processing parameters, wherein the Time is in seconds, the Pressure (press.) is in milliTorr, the Power is in Watts, the Spacing between the top electrode and bottom susceptor of the PECVD chamber is in mils, and the temperature (Temp.) is in degrees centigrade (° C.). Also shown in rows 4 through 8 are the flow rates in standard cubic centimeters per minute (sccm) for the gas and gas mixtures in each of the process steps (cols. 1–5) for the gases $N_2O$, $SiH_4$, $NH_3$, $N_2$, and He, respectively. The He flow rate for the plasma treatment (col. 5) can have a range of between about 400 and 700 sccm. The RF (radio frequency) power for the plasma treatment is preferably between about 50 and 250 Watts. The CVD silicon oxide layer 22 (col. 1) is deposited to a thickness of between about 200 and 500 Angstroms, but more specifically to a thickness of 300 Angstroms. The silicon nitride layer 24 (col. 3) is deposited to a thickness that depends on the spacing L between the metal (see FIG. 3), but preferably to a thickness of between about 3000 and 5000 Angstroms when the spacing L is between about 0.475 and 0.575 micrometers (um), respectively.

Typically the silicon nitride layer 24 is nonconformal and generally results in channel voids (keyholes) because of the nature of the deposition, which provides a higher flux of deposition material at the top of the metal lines than is deposited in the recesses between the metal lines. The keyhole problem is minimized by using a thin $Si_3N_4$ layer and the number of pinholes in the $Si_3N_4$ layer is reduced, by the method of the above inventive process, by using an additional plasma treatment step (col. 5) following the $Si_3N_4$ deposition (col. 3). The improvement is due in part to the sputtering of loosely attached atoms from the $Si_3N_4$ surface and redeposition to other sites, also resulting in a more dense $Si_3N_4$ during the plasma treatment steps in col. 5 of TABLE I. Alternatively, in the plasma treatment step (col. 5), another inert gas such as argon (Ar) can be used in place of the He, or a gas mixture of Ar and He can be used to achieve the same desired effect.

Still referring to FIG. 4, a photoresist layer 26 is formed on the passivation layer 24 by spin coating and patterned by conventional photolithographic techniques for etching via holes 3 in layer 24 to the metal lines 20. Preferably the via holes are etched using, for example, reactive ion etching or high-density plasma etching using a gas mixture containing carbon tetrafluoride ($CF_4$), trifluoromethane ($CHF_3$), and a carrier gas such as He or Ar.

Figure 5:
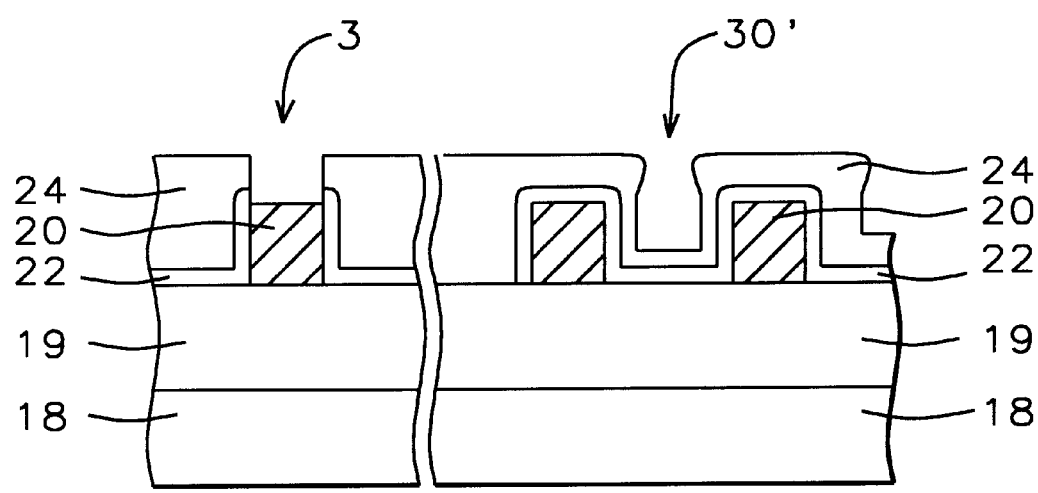

Referring now to FIG. 5, the photoresist 26 is stripped, for example by plasma ashing in oxygen ($O_2$) without leaving any photoresist residue in the keyhole areas 30'. Also, the sequence of plasma treatment steps described above also results in a denser silicon nitride having fewer pinholes.

EXAMPLE

To better appreciate the advantages of the inventive process which includes a plasma treatment step (col. 5 of TABLE I), TABLE II below shows the percentage of pinhole failures for various $Si_3N_4$ thicknesses (in cols. 1–3) as a function of increasing RF power in rows 1–5. The pinholes were detected by subjecting the $Si_3N_4$ passivation layer 24 to a solution of 10% by weight of potassium hydroxide (KOH) in water ($H_2O$) at a temperature of 45° C. for 30 minutes. This results in the metal lines 20 changing color when the KOH enters the pinholes. TABLE II shows the change in failure rate percentage when the RF power was increased from 0 to 250 Watts for $Si_3N_4$ thicknesses of between 3000 and 5000 Angstroms during the plasma treatment steps.

TABLE II

Passivation plasma treatment pinhole test results

| RF Power | col. 1 5K SiN % Fail | col. 2 4K SiN % Fail | col. 3 3K SiN % Fail |
|---|---|---|---|
| row 1   0 Watts | 30 | 70 | 100 |
| 2 100 Watts |  | 50 |  |
| 3 150 Watts | 0 | 0 | 75 |
| 4 200 Watts | 0 | 15 | 95 |
| 5 250 Watts | 10 |  |  |

As clearly seen from the table, when the RF power for the plasma treatment step in He (col. 5 of TABLE I) was increased from 0 Watts to 200 Watts for a 5000 Angstrom $Si_3N_4$ layer, the pinhole failure rate decreased from 30% to 0%, and for the 4000 Angstrom $Si_3N_4$ layer, the pinhole failure rate decreased from 50% to 0% when the RF power was increased from 100 to 150 Watts. For $Si_3N_4$ layers less than 3000 Angstroms, the method is less effective because the passivation layer is too thin, as indicated by the high percentage of pinhole failure rates.

While the invention has been particularly shown and described with reference to the preferred embodiment thereof, it will be understood by those skilled in the art that various changes in form and details may be made without departing from the spirit and scope of the invention.

What is claimed is:

1. A method for fabricating an improved plasma-enhanced chemical vapor deposited passivation layer over metal interconnections on a substrate comprising the steps of:
   depositing a metal layer on said substrate;
   patterning said metal layer forming metal lines for said metal interconnections;
   depositing a silicon oxide layer on said patterned metal layer;
   depositing a silicon nitride layer on said silicon oxide layer by plasma-enhanced chemical vapor deposition at temperatures resulting in a nonconformal layer that is sufficiently thin to prevent keyholes in said silicon nitride layer between said metal lines;
   performing a plasma treatment on said silicon nitride layer using an inert gas to densify said silicon nitride layer, and thereby resulting in fewer pinholes in said silicon nitride layer;
   depositing and patterning a photoresist layer to provide openings for via holes;
   etching said via holes in said silicon nitride layer and said silicon oxide layer to said metal lines;
   stripping said photoresist layer providing said via holes while removing completely said photoresist without leaving photoresist residue between said metal lines, thereby completing said plasma-enhanced chemical vapor deposited passivation layer composed of said silicon nitride layer.

2. The method of claim 1, wherein said metal layer is composed of aluminum/copper alloy having a thickness of between about 5000 and 9000 Angstroms.

3. The method of claim 1, wherein said silicon oxide is deposited by plasma-enhanced chemical vapor deposition using a gas mixture of nitrous oxide ($N_2O$) and silane ($SiH_4$), and is deposited to a thickness of between about 200 and 500 Angstroms.

4. The method of claim 1, wherein said silicon nitride layer is deposited by plasma-enhanced chemical vapor deposition using a gas mixture of silane ($SiH_4$), ammonia ($NH_3$), and nitrogen ($N_2$), and is deposited to a thickness of between about 3000 and 5000 Angstroms.

5. The method of claim 1, wherein said plasma treatment in said inert gas is carried out in a plasma-enhanced chemical vapor deposition system comprising the steps of:
   a plasma treatment of said silicon nitride layer using said inert gas at a flow rate of between about 400 and 700 standard cubic centimeters per minute (sccm), at an RF power of between about 50 and 250 Watts, at a pressure of between about 2.5 and 4.0 milliTorr, and for a time of between about 50 and 100 seconds.

6. The method of claim 5, wherein said inert gas is helium (He).

7. The method of claim 5, wherein said inert gas is argon (Ar).

8. The method of claim 5, wherein said inert gas is a mixture of helium (He) and argon (Ar).

9. The method of claim 1, wherein said via holes are etched using reactive ion etching (RIE) using a gas mixture of carbon tetrafluoride ($CF_4$) and trifluoromethane ($CHF_3$).

10. The method of claim 1, wherein said photoresist is stripped by plasma ashing in oxygen ($O_2$).

11. The method of claim 1, wherein said silicon oxide layer, said silicon nitride layer, and said plasma treatment are carried out consecutively in a plasma-enhanced chemical vapor deposition system.

12. A method for fabricating an improved plasma-enhanced chemical vapor deposited passivation layer over metal interconnections on a substrate comprising the steps of:

depositing a metal layer on said substrate;

patterning said metal layer forming metal lines for said metal interconnections;

depositing a silicon oxide layer on said patterned metal layer;

depositing a silicon nitride layer on said silicon oxide layer by plasma-enhanced chemical vapor deposition at temperatures resulting in a nonconformal layer that is sufficiently thin to prevent keyholes in said silicon nitride layer between said metal lines;

performing a plasma treatment on said silicon nitride layer to densify said silicon nitride layer, and thereby resulting in fewer pinholes in said silicon nitride layer whereby said plasma treatment is in a plasma-enhanced chemical vapor deposition chamber using helium (He);

depositing and patterning a photoresist layer to provide openings for via holes;

etching said via holes in said silicon nitride layer and said silicon oxide layer to said metal lines;

stripping said photoresist layer providing said via holes and removing completely said photoresist without leaving photoresist residue between said metal sines, thereby completing said plasma-enhanced chemical vapor deposited passivation layer composed of said silicon nitride layer.

13. The method of claim 12, wherein said metal layer is composed of aluminum/copper alloy having a thickness of between about 5000 and 9000 Angstroms.

14. The method of claim 12, wherein said silicon oxide is deposited by plasma-enhanced chemical vapor deposition using a gas mixture of nitrous oxide ($N_2O$) and silane ($SiH_4$), and is deposited to a thickness of between about 200 and 500 Angstroms.

15. The method of claim 12, wherein said silicon nitride is deposited by plasma-enhanced chemical vapor deposition using a gas mixture of silane ($SiH_4$), ammonia ($NH_3$) and nitrogen ($N_2$), and is deposited to a thickness of between about 3000 and 5000 Angstroms.

16. The method of claim 12, wherein said plasma treatment using said helium is carried out at a flow rate of between about 400 and 700 standard cubic centimeters per minute (sccm), at an RF power of between about 50 and 250 Watts, at a pressure of between about 2.5 and 4.0 milliTorr, and for a time of between about 50 and 100 seconds.

17. The method of claim 12, wherein said via holes are etched using reactive ion etching (RIE) using a gas mixture of carbon tetrafluoride ($CF_4$) and trifluoromethane ($CHF_3$).

18. The method of claim 12, wherein said photoresist is stripped by plasma ashing in oxygen ($O_2$).

19. A method for fabricating an improved plasma-enhanced chemical vapor deposited passivation layer over metal interconnections on a substrate comprising the steps of:

depositing a metal layer on said substrate;

patterning said metal layer forming metal lines for said metal interconnections;

depositing a silicon oxide layer on said patterned metal layer;

depositing a silicon nitride layer on said silicon oxide layer by plasma-enhanced chemical vapor deposition at temperatures resulting in a nonconformal layer that is sufficiently thin to prevent keyholes in said silicon nitride layer between said metal lines;

performing a plasma treatment on said silicon nitride layer to densify said silicon nitride layer, and thereby resulting in fewer pinholes in said silicon nitride layer whereby said plasma treatment is in a plasma-enhanced chemical vapor deposition chamber using a gas mixture of helium (He) and argon (Ar);

depositing and patterning a photoresist layer to provide openings for via holes;

etching said via holes in said silicon nitride layer and said silicon oxide layer to said metal lines;

stripping said photoresist layer providing said via holes and removing completely said photoresist without cleaving photoresist residue between said metal lines, thereby completing said plasma-enhanced chemical vapor deposited passivation layer composed of said silicon nitride layer.

20. The method of claim 19, wherein said metal layer is composed of aluminum/copper alloy having a thickness of between about 5000 and 9000 Angstroms.

21. The method of claim 19, wherein said silicon oxide is deposited by plasma-enhanced chemical vapor deposition using a gas mixture of nitrous oxide ($N_2O$) and silane ($SiH_4$), and is deposited to a thickness of between about 200 and 500 Angstroms.

22. The method of claim 19, wherein said silicon nitride is deposited by plasma-enhanced chemical vapor deposition using a gas mixture of silane ($SiH_4$), ammonia ($NH_3$) and nitrogen ($N_2$), and is deposited to a thickness of between about 3000 and 5000 Angstroms.

23. The method of claim 19, wherein said plasma treatment using said gas mixture of He and Ar is carried out at a flow rate of between about 400 and 700 standard cubic centimeters per minute (sccm), at an RF power of between about 50 and 250 Watts, at a pressure of between about 2.5 and 4.0 milliTorr, and for a time of between about 50 and 100 seconds.

24. The method of claim 19, wherein said via holes are etched using reactive ion etching (RIE) using a gas mixture of carbon tetrafluoride ($CF_4$) and trifluoromethane ($CHF_3$).

25. The method of claim 19, wherein said photoresist is stripped by plasma ashing in oxygen ($O_2$).

* * * * *